United States Patent
Liu et al.

(10) Patent No.: US 8,643,158 B2
(45) Date of Patent: Feb. 4, 2014

(54) SEMICONDUCTOR PACKAGE AND LEAD FRAME THEREFOR

(75) Inventors: Peng Liu, Tianjin (CN); Qingchun He, Tianjin (CN); Ping Wu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/413,652

(22) Filed: Mar. 7, 2012

(65) Prior Publication Data

US 2012/0248590 A1    Oct. 4, 2012

(30) Foreign Application Priority Data

Apr. 1, 2011   (CN) .......................... 2011 1 0082117

(51) Int. Cl.
*H01L 23/495* (2006.01)
*H01L 21/56* (2006.01)

(52) U.S. Cl.
USPC ............. 257/676; 257/666; 257/E23.031; 257/E23.037; 257/E23.042; 257/E23.043; 257/E23.046; 257/E23.061; 174/537; 174/552

(58) Field of Classification Search
USPC .......... 257/666, 676, 692, E23.031, E23.037, 257/E23.042, E23.043, E23.046, E23.061; 174/537, 552
See application file for complete search history.

(56) References Cited

U.S. PATENT DOCUMENTS

| | | | |
|---|---|---|---|
| 6,246,111 B1 * | 6/2001 | Huang et al. .................. | 257/675 |
| 6,271,581 B2 * | 8/2001 | Huang et al. .................. | 257/666 |
| 6,605,866 B1 * | 8/2003 | Crowley et al. ............... | 257/692 |
| 6,917,097 B2 | 7/2005 | Chow | |
| 7,405,106 B2 | 7/2008 | Maloney | |
| 7,414,318 B2 | 8/2008 | Shim | |
| 7,476,569 B2 | 1/2009 | Retuta | |
| 7,598,598 B1 * | 10/2009 | Bancod et al. ............... | 257/666 |
| 7,671,451 B2 | 3/2010 | Lee | |
| 7,700,404 B2 | 4/2010 | Punzalan | |
| 7,781,878 B2 | 8/2010 | Chen | |
| 7,847,392 B1 | 12/2010 | Choi | |
| 7,858,442 B2 | 12/2010 | Do | |
| 2008/0029856 A1 * | 2/2008 | Chou et al. .................... | 257/666 |
| 2008/0029860 A1 * | 2/2008 | Gao .............................. | 257/675 |
| 2008/0122048 A1 * | 5/2008 | Chan et al. .................... | 257/666 |
| 2008/0258272 A1 * | 10/2008 | Lim .............................. | 257/666 |
| 2012/0103663 A1 * | 5/2012 | Kobayashi et al. ........... | 174/251 |

* cited by examiner

*Primary Examiner* — Peniel M Gumedzoe
(74) *Attorney, Agent, or Firm* — Charles Bergere

(57) ABSTRACT

A semiconductor package is assembled using first and second lead frames. The first lead frame includes a die flag and the second lead frame includes lead fingers. When the first and second lead frames are mated, the lead fingers surround the die flag. Side surfaces of the die flag are partially etched to form an extended die attach surface on the die flag, and portions of the top surface of each of the lead fingers also are partially etched to form lead finger surfaces that are complementary with the etched side surfaces of the die flag. A semiconductor die is attached to the extended die attach surface and bond pads of the semiconductor die are electrically connected to the lead fingers. An encapsulating material covers the die, electrical connections, and top surfaces of the die flag and lead fingers.

9 Claims, 4 Drawing Sheets

SEMICONDUCTOR PACKAGE AND LEAD FRAME THEREFOR

BACKGROUND OF THE INVENTION

The present invention relates generally to semiconductor device packages, and more particularly to a lead frame design for quad flat no-lead (QFN) packages.

Semiconductor devices are widely used today. As these devices become smaller and more functional, it is desirable to have device packages that can accommodate larger dies with enhanced functionality.

One way of packaging the semiconductor dies involves the use of a lead frame that has a die pad on which one or more dies are mounted. The lead frame also includes electrical leads that project outwardly from the package and are used to allow electrical signals to be received by and transmitted from the one or more dies to a printed circuit board (PCB), or other external devices.

Another type of lead frame based package is a leadless package, such as dual flat no-lead (DFN) and quad flat no-lead (QFN) packages. In such packages, the leads do not project outwardly from the package but instead are flush with either the sides or bottom of the package, or both.

FIG. 1 is a cross-sectional view of a conventional leadless semiconductor package 10 having a semiconductor die 12, a lead frame 14 having a die flag 16 and lead fingers 18 surrounding the die flag 16. Bond pads of the semiconductor die 12 are electrically coupled to the lead fingers 18 with bond wires 20. A molding compound 22 encapsulates the semiconductor die 12 and the bond wires 20 to form the semiconductor package 10.

However, as can be seen, the size of the semiconductor die 12 that can be incorporated in the package 10 is limited by the size of the die flag 16 of the lead frame 14. Therefore, larger lead frames may be required to package large semiconductor dies thereby resulting in size, design and cost penalties. Moreover, use of larger lead frames may lead to additional customization requirements as smaller dimensioned interconnect configurations cannot be used.

Therefore a need exists for semiconductor packaging techniques that facilitate packaging of large semiconductor dies without increasing the overall package size.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 4A is a cross-sectional, side view showing partially etched lead fingers of a lead frame;

FIG. 4B illustrates the partially etched lead fingers of FIG. 4A and a partially etched die flag;

FIG. 4C illustrates a step of attaching a semiconductor die to an extended die attach surface of the die flag using a die attach adhesive;

FIG. 4D illustrates a step of electrically connecting the semiconductor die to the leads of the lead frame; and FIG. 4E illustrates a step of dispensing an encapsulating material onto a top surface of the lead frame.

DETAILED DESCRIPTION OF THE INVENTION

Figure 1:
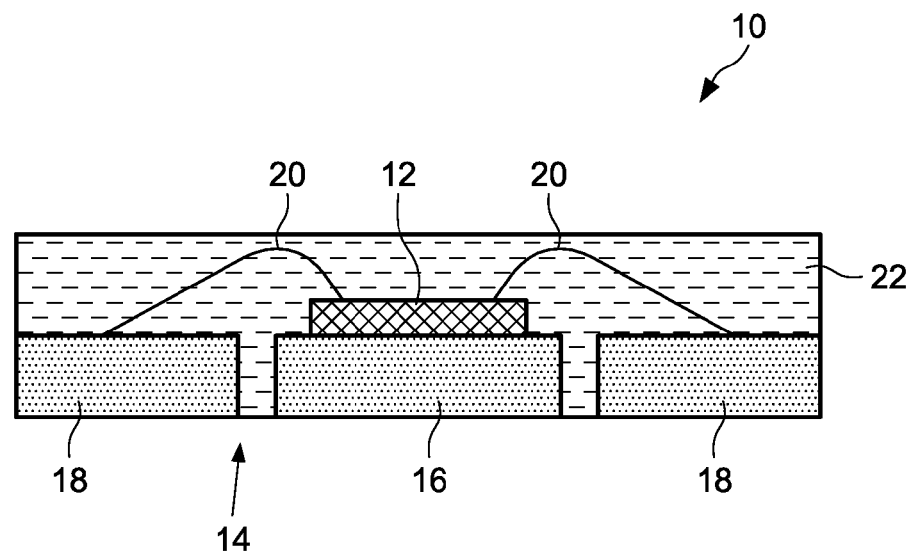
FIG. 1 is a cross-sectional, side view of a conventional leadless semiconductor package.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein.

Further, the terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise.

It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of packaging a semiconductor die. The method includes providing a lead frame structure having a first lead frame including a die flag and a second lead frame including lead fingers. The first and second lead frames preferably comprise separate lead frame panels that are mated during the assembly process. A thickness of the die flag is greater than a thickness of the lead fingers. Side surfaces of the die flag are half etched to form an extended die attach surface, while a top surface of each of the lead fingers is half etched to form lead finger surfaces that are complementary with the extended die attach surface. The die flag and lead fingers are arranged such that the lead fingers accommodate the extended die attach surface. A semiconductor die is attached to the extended die attach surface and bond pads of the semiconductor die are electrically connected to the lead fingers of the lead frame. An encapsulating material covers a top surface of the lead frame, die, and the electrical connections therebetween.

In another embodiment, the present invention provides a lead frame structure for a packaging a semiconductor integrated circuit. The lead frame structure includes a die flag formed on a first lead frame and lead fingers formed on a second, separate lead frame. The first and second lead frames are mated during an assembly process such that the lead fingers surround the die flag. Side surfaces of the die flag are partially etched to form an extended die attach surface. A portion of a top surface of each of the lead fingers also is partially etched to form lead finger surfaces complementary to the etched die flag surfaces in order to accommodate the extended die attach surface of the die flag.

Figure 2:
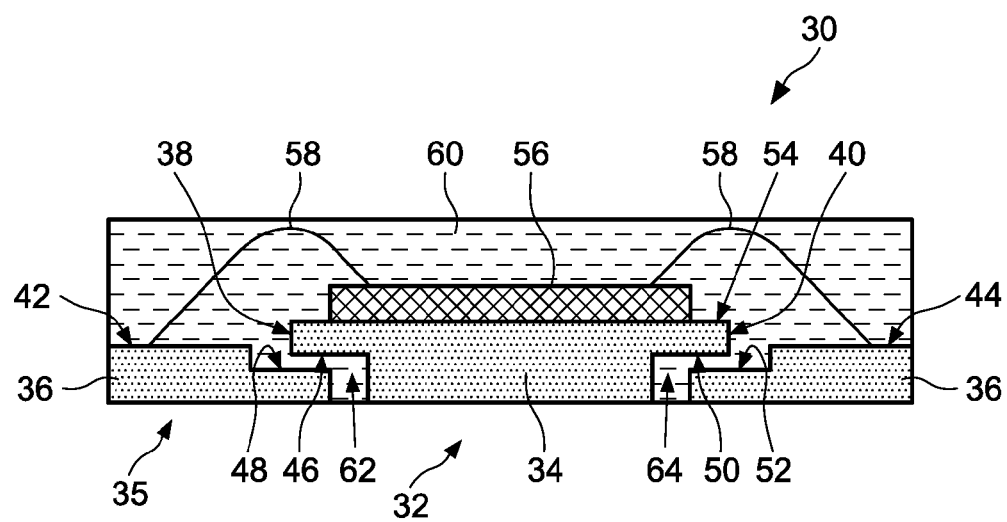
FIG. 2 is a cross-sectional, side view of a packaged semiconductor device in accordance with one embodiment of the present invention.

Referring now to FIG. 2, a cross-sectional view of a packaged semiconductor device 30 in accordance with an embodiment of the present invention is shown. The semiconductor device 30 includes a first lead frame 32 with a die flag 34 and a second lead frame 35 having a plurality of lead fingers 36. The first and second lead frames 32, 35 are mated such that the die flag 34 is surrounded by the lead fingers 36. The lead frames 32 and 35 may be formed of an electrically conductive material that is easy to shape, such as a conductive metal like aluminum or copper or an alloy of copper. The conductive metal may be bare, partially plated, or plated with another metal or an alloy such as iron/nickel alloy, silver, or the like. Further, the die flag 34 and the lead fingers 36 may be formed separately with the die flag 34 being placed within the lead fingers during the assembly process. In the presently preferred embodiment, the die flag 34 is thicker than the lead fingers 36.

In the exemplary embodiment shown in FIG. 2, side surfaces 38 and 40 of the die flag 34 and top surfaces 42 and 44 of each of the lead fingers 36 are partially etched to form complementary surfaces represented by reference numerals 46, 48 and 50, 52 that form an extended die attach surface 54 on the die flag 34.

In one exemplary embodiment of the present invention, the side surfaces 38 and 40 of the die flag 34 and portions of the top surfaces 42 and 44 of the lead fingers 36 are half etched to form the extended die attach surface 54 and complementary lead fingers. It should be noted that the extended die attach surface 54 formed by partial etching of the die flag 34 and lead fingers 36 facilitates incorporation of a larger die within the package 30 as compared to the conventional semiconductor package 10 shown in FIG. 1.

A semiconductor die 56 is attached to the extended die attach surface 54 and is electrically coupled to the lead fingers 36. The semiconductor die 56 may be for example a flash memory chip (NOR/NAND), a controller chip, a microprocessor, an ASIC, or the like. The semiconductor die 56 may be attached to the extended die attach surface 54 using a die attach adhesive such as epoxy or elastomer. However, other suitable adhesive materials as are known in the art also may be utilized. As the semiconductor die 56 and die attach adhesive are well known in the art, further descriptions and possible alternative embodiments are not necessary for a complete understanding of the present invention.

In this exemplary embodiment of the invention, bond pads of the semiconductor die 56 are electrically coupled to the lead fingers 36 of the lead frame 32 with wires 58. The wires 58 may be bonded to the bond pads of the semiconductor die 56 and to corresponding contact pads on the lead fingers 36 using known wire bonding techniques and wire bonding equipment. The wires 58 are formed of a conductive material, such as gold or aluminum and may be bare or coated, as is known in the art.

An encapsulating material 60 is deposited onto a top surface of the semiconductor die 56, the lead fingers 36 and within gaps 62 and 64 between the complementary surfaces 46, 48 and 50, 52 of the die flag 34 and the lead fingers 36. The encapsulating material 60 also covers the wires 58. The encapsulating material 60 may include plastic or an epoxy molding compound, as is known in the art. The example configuration of the packaged semiconductor device of FIG. 2 is employed in a flat no-lead package (DFN or QFN) although a leaded device is also within the scope of the present invention.

Figure 3:
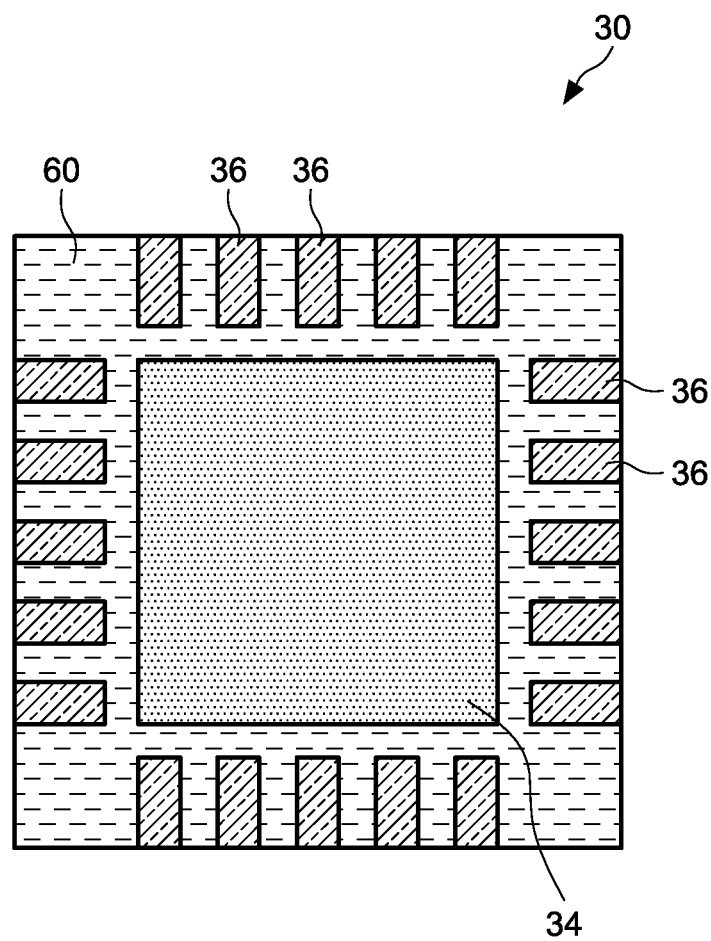
FIG. 3 is a bottom, plan view of the packaged semiconductor device of FIG. 2.

FIG. 3 is bottom plan view of the semiconductor device 30. As can be seen, the semiconductor device is a QFN type package. Also shown are the exposed bottom surface of the die flag 34 and exposed portions of the lead fingers 36. The complementary etched side surfaces of the die flag 34 and lead fingers 36 allow for a larger size die to be accommodated within a package having the same overall dimensions as the conventional device 10 of FIG. 1. For example, in one embodiment, the die flag size is increased by 20%, which allows for a corresponding increase in die size. Of course, as will be understood by those of skill in the art, increased die size also will depend on overall package requirements.

Figure 4A:
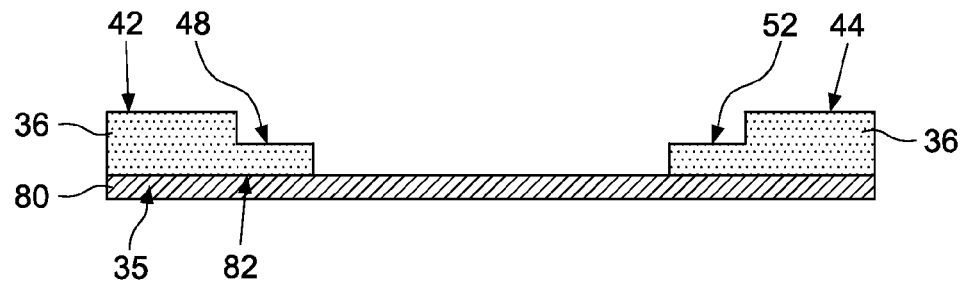
FIGS. 4A-4E illustrate steps of assembling a semiconductor device in accordance with an embodiment of the present invention, where

FIGS. 4A-4E illustrate various steps for assembling the semiconductor device 30. Referring now to FIG. 4A, a cross-sectional, side view of the partially etched lead fingers 36 of the second lead frame 35 are shown. Although only one of the second lead frames 35 is depicted in the drawings, it is to be understood that the lead frame 35 may be formed from an array or panel of lead fames such that multiple devices may be assembled simultaneously.

As illustrated, portions of the top surfaces 42 and 44 of each of the lead fingers 36 are partially etched to form lead finger surfaces 48 and 52. The etched portions are located at the ends of the lead fingers that are proximate a central void within the second lead frame 35. The etched portions of the lead fingers 36 may have an etched depth of about one-half of the overall thickness of the lead fingers. For example, if the lead fingers 36 are 5 mils thick then the etched portions of the lead fingers will be about 2.5-3.0 mils thick. In the illustrated embodiment, the second lead frame 35 is attached to a tape 80, such as a high-temperature adhesive tape, with a bottom surface 82 of the second lead frame 35 being attached to the adhesive tape 80. (As used herein, 1.0 mils is approximately 0.0254 mm).

Figure 4B:
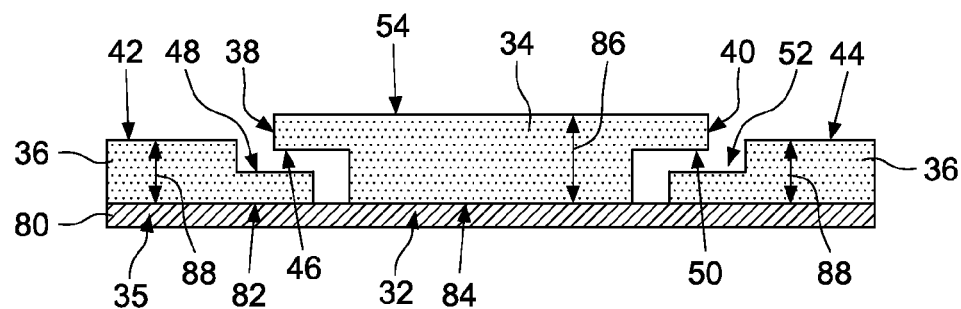

FIG. 4B illustrates the die flag 34 of the first lead frame 32 arranged within the lead fingers 36 such that the lead fingers 36 surround the die flag 34. Like the lead fingers 36, a bottom surface 84 of the die flag 34 is attached to the tape 80. Although only one die flag 34 is shown, the die flag 34 may be formed as a panel or array of die flags that mates with a complementary panel of sets of lead fingers so that multiple devices may be simultaneously formed. As illustrated, the side surfaces 38 and 40 of the die flag 34 are half etched to form the extended die attach surface 54 on the die flag 34. It should be noted that the lead finger surfaces 48 and 52 are complementary to the etched die flag surfaces 46 and 50.

In the embodiment shown, the die flag 34 has a thickness 86 that is greater than a thickness 88 of the lead fingers 36. In one exemplary embodiment, the thickness 86 of the unetched portion of the die flag 34 is about 8 mils and the thickness 88 of the unetched portion of the lead fingers 38 is about 5 mils; while the thicknesses of the etched portion of the die flag 34 is 4 mils and the thickness of the etched portions of the lead fingers 36 are about 2.5 mils. Further, the die flag 34 is spaced from the lead fingers 36 preferably by about 1.5 to 2.5 mils. In one embodiment, the gaps 62, 64 or spacing between the die flag 34 and the lead fingers 36 is 2.5 mils.

As can be seen, the complementary lead finger surfaces 48 and 52 accommodate the extended die attach surface 54. The selective etching of the die flag 34 and the lead fingers 36 may be performed using a known chemical etching process.

Figure 4C:
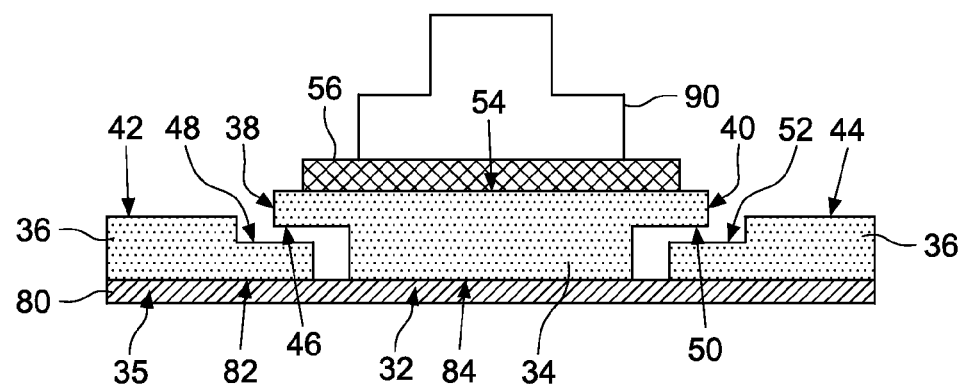

FIG. 4C illustrates a step of attaching the semiconductor die 56 to the extended die attach surface 54. The semiconductor die 56 is attached to extended die attach surface 54 with a die attach adhesive such as die-bonding epoxy. The semiconductor die 56 may be placed on the die attach surface 54 using a pick and place tool 90.

Figure 4D:
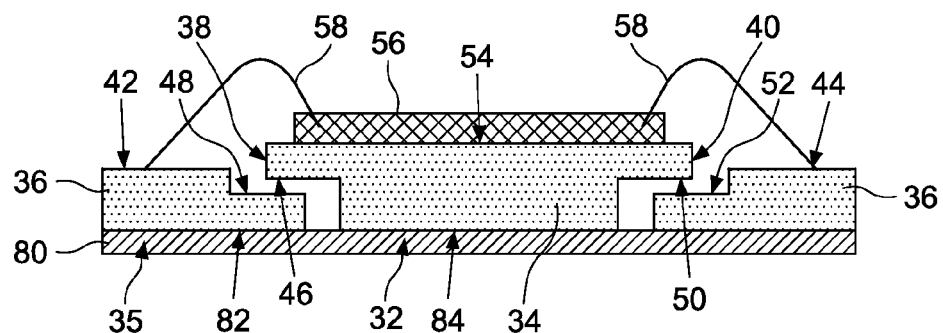

FIG. 4D shows the step of electrically connecting the semiconductor die 56 to the first lead frame 32. In this exemplary embodiment of the invention, bond pads of the semiconductor die 56 are electrically connected to the corresponding pads on the lead fingers 36 with the wires 58 using a well known wire bonding process and known wire bonding equipment. As can be seen, in the preferred embodiment, the wires 58 are bonded to the unetched portions of the lead fingers 36.

Figure 4E:
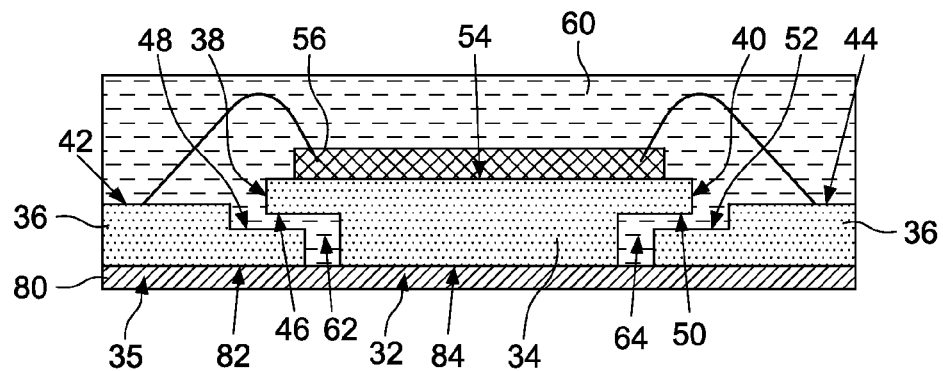

FIG. 4E shows the step of dispensing an encapsulating material 60 such as epoxy onto a top surface of the lead frame 32. The encapsulating material 60 covers the semiconductor die 56, the lead fingers 36 and the wires 58. The encapsulating material 60 fills the gaps 62 and 64 between the complementary surfaces 46, 48 and 50, 52 of the die flag 34 and the lead fingers 36. The lead fingers 36, die 54 and wires 58 may be encapsulated using known methods such as with a nozzle of a conventional dispensing machine or in mold chase and via injection molding, as is known in the art. Alternative known materials that may be used for the encapsulating material 60 include a silica-filled resin, a ceramic, a halide-free material, the like, or combinations of the above. The encapsulating material is typically applied in liquid form and then cured until transformed to a solid form.

The semiconductor device 30 shown in FIG. 2 then is formed by removing the tape 80 and if multiple devices are simultaneously formed, separating the devices from each other such as via saw singulation.

Although the assembly process described above shows only a single die 56, it will be appreciated by those skilled in the art that the process may be utilized to form a stacked die package or a multi-die package in which more than one die is mounted on the die flag 34 or there is more than one die flag 34.

The present invention, as described above, allows for packaging a large semiconductor die without changing the overall package size. An extended die attach surface is formed by partial etching of the die flag and lead fingers of the lead frames to form complementary surfaces that provide an extended die attach surface on the die flag. Thus, a larger die can be accommodated within the same package design employed for a relatively smaller die. Advantageously, larger die size facilitates more functions for the device without requiring package design changes.

Thus, the present invention provides a method of packaging a semiconductor die that can accommodate larger die in packaged configurations such as QFN packages.

By now it should be appreciated that there has been provided an improved semiconductor package and lead frame thereof. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A packaged semiconductor device, comprising:
    a die flag including a horizontally extended die attach portion;
    a plurality of lead fingers that surround and are spaced from the die flag, wherein proximal ends of the lead fingers are located beneath the horizontally extended die attach portion of the die flag, and wherein a top surface of each of the lead fingers is stepped such that a thickness of a distal end of each of the lead fingers is greater than a thickness of the proximal end of each of the lead fingers;
    a semiconductor die attached to a top surface of the horizontally extended die attach portion of the die flag and electrically coupled to the lead fingers; and
    an encapsulating material that covers the die, the lead fingers and fills gaps between the die flag and at least upper surfaces of the proximal ends of the lead fingers.

2. The packaged semiconductor device of claim 1, wherein a thickness of the die flag is greater than a thickness of the proximal ends of the lead fingers.

3. The packaged semiconductor device of claim 1, wherein the encapsulating material comprises epoxy.

4. The packaged semiconductor device of claim 1, wherein bonding pads of the semiconductor die are electrically coupled to corresponding ones of the lead fingers with bond wires.

5. The packaged semiconductor device of claim 1, wherein the packaged semiconductor device comprises a quad flat no-lead (QFN) package.

6. A lead frame structure for packaging a semiconductor integrated circuit, the lead frame structure comprising:
    a first lead frame including a die flag, wherein the die flag comprises a horizontally extended die attach portion; and
    a second lead frame including a plurality of lead fingers, wherein when the first and second lead frames are mated, the lead fingers of the second lead frame surround yet are spaced from the die flag of the first lead frame and a proximal end of each of the lead fingers is located beneath the horizontally extended die attach portion of the die flag, wherein bottom surfaces of the lead fingers and the die flag are coplanar and wherein a top surface of each of the lead fingers is stepped such that a thickness of a distal end of each of the lead fingers is greater than a thickness of the proximal end of each of the lead fingers.

7. The lead frame structure of claim 6, wherein a thickness of the die flag is greater than the thickness of the distal end of each of the lead fingers.

8. The lead frame structure of claim 6, wherein a thickness of the proximal end of each of the lead fingers is about 2.5 mils and a vertical distance from a bottom surface of the horizontally extended die attach portion to a bottom surface of the die flag is about 4 mils.

9. The lead frame structure of claim 6, wherein the first lead frame includes a plurality of die flags and the second lead frame includes a corresponding plurality of sets of leads fingers.

* * * * *